United States Patent [19]

Clement

[11] 4,335,418
[45] Jun. 15, 1982

[54] ELECTRONIC INTERRUPTER

[75] Inventor: Mark W. P. Clement, Owen Sound, Canada

[73] Assignee: General Signal Corporation, Stamford, Conn.

[21] Appl. No.: 201,100

[22] Filed: Oct. 27, 1980

[51] Int. Cl.³ .......................................... H01H 47/32
[52] U.S. Cl. ............................... 361/152; 307/132 E; 318/127; 318/130; 318/134; 340/384 E; 340/396; 340/403; 361/196; 361/197; 361/203
[58] Field of Search ............... 361/152, 196, 197, 198, 361/203; 340/384 E, 388, 396, 403, 392; 307/132 E, 132 W, 132 M; 331/111, 116 M, 143, 149, 154; 310/31, 34, 39; 417/416, 417; 318/127-132, 134

[56] References Cited

U.S. PATENT DOCUMENTS

| 3,027,554 | 3/1962 | Cassell | 340/396 X |
| 3,184,622 | 5/1965 | Levine | 310/31 X |
| 3,287,608 | 11/1966 | Pokrant | 361/152 |
| 3,515,966 | 6/1970 | De Valrogers et al. | 310/31 X |
| 3,846,792 | 11/1974 | Haigh | 340/388 X |
| 4,122,378 | 10/1978 | Brown | 417/417 X |

FOREIGN PATENT DOCUMENTS 1185652  1/1965  Fed. Rep. of Germany ...... 331/111

Primary Examiner—Harry E. Moose, Jr.
Attorney, Agent, or Firm—George W. Killian; Milton E. Kleinman

[57] ABSTRACT

A circuit for controlling the intermittent application of a dc potential to a device, such as a striker mechanism for a gong, having a member reciprocally moveable between rest and active positions. The reciprocating member shunts and unshunts a capacitor when the member is in its rest position and moved away therefrom, respectively. While the capacitor is shorted, and during its charge time, dc power is applied to the device. When the capacitor is charged to a predetermined potential, dc power is disconnected from the device thereby allowing the reciprocating member to return to its rest position to shunt the capacitor and initiate a new cycle of operation. The system is substantially independent of mechanical characteristics of the device and the current interrupted or made by the contact pair may be at least an order of magnitude less than the peak current in said device.

11 Claims, 3 Drawing Figures

ELECTRONIC INTERRUPTER

BACKGROUND OF THE INVENTION

The invention pertains to electromechanical devices having a reciprocally moving member moveable between two limits. A typical structure of this character comprises a striker mechanism for a gong. Devices of this nature may be operated with either ac or dc current. When ac current is used, it is necessary to either design the device to function with the frequency of the available ac current; or to provide an ac current having a frequency adapted to certain characteristics of the mechanism. When the devices are to be used with dc current, it is necessary to provide for intermittent, or interrupted, application of the dc potential to the actuating solenoid. For decades, it has been customary to manufacture bells, buzzers, and gongs wherein the mechanism for interrupting the application of dc power to the actuating solenoid comprises a pair of mechanical contacts which are closed when the device is in its rest position and which are opened in response to the actuation of the reciprocating member. Devices of this nature have a variety of disadvantages including, but not limited to, the following:

(1) The contacts must be capable of interrupting the peak current to the solenoid;

(2) The adjustment of the contacts with respect to when they make and break relative to the motion of the reciprocating member may be critical;

(3) The contacts sometimes pit or burn and become inoperative and/or stick together and fail to open;

(4) The frequency of operation per unit time may be varied only over narrow limits.

In view of these disadvantages of the simple circuit for interrupting current to the actuating solenoid, a wide variety of designs have been proposed to overcome these difficulties. For example, U.S. Pat. No. 3,781,877 issued Dec. 25, 1973 to Berns provides an astable multivibrator for driving the solenoid. U.S. Pat. No. 3,931,549 issued Jan. 6, 1976 to Berns et al discloses a structure requiring two windings on the solenoid and making use of opposing magnetic fluxes. Other U.S. Pat. Nos. such as 4,153,898 issued May 8, 1979 to Larime; 4,136,377 issued Jan. 23, 1979 to Larime; 4,005,413 issued Jan. 25, 1977 to Berns; and 3,656,156 issued Apr. 11, 1972 to Berns disclose a variety of devices of the class first described. All of the cited patents are assigned to the same assignee as the present invention.

Because bells, chimes, gongs, and buzzes are such ubiquitous devices, a wide variety thereof have been designed and manufactured for special and general applications. Many designs have been made the subject of patent applications and many patents disclosing individual features thereof may be found in the art.

SUMMARY OF THE INVENTION

The present invention is directed to an electronic structure for actuating a reciprocating member which functions in response to the application of dc potential. It overcomes the difficulties associated with prior art devices by including an electronic control circuit which intermittently opens and closes the circuit to the actuating solenoid without requiring contacts which directly open and close the circuit to the solenoid. Accordingly, the traditional contacts and all the problems related thereto are eliminated. Instead, a solid-state circuit is provided which allows current to flow to the actuating solenoid only when a dc potential is applied and while a pair of contacts, associated with the reciprocating member, are closed and while a capacitor shunted by the recited contacts charges to a predetermined potential after the contacts are open. That is, before the application of dc potential, the reciprocating member maintains a pair of contacts closed and these contacts provide a shunt on a capacitor. Upon the application of dc potential the solenoid is actuated thereby moving the reciprocating member from its rest position and unshunting the capacitor. The capacitor commences to charge and after a period of time determined by the time constant of the capacitor and an associated resistor, the capacitor is charged to a predetermined potential and when said capacitor reaches said predetermined potential, a conduction control device is caused to interrupt the current to the actuating solenoid. This allows the reciprocating member to return to its rest position thereby closing the contacts to shunt the capacitor and initiating a new cycle of operation. It will be seen that the system is independent of the mechanical characteristics of the device and the current interrupted or made by the contact pair is very small as compared with the actuating solenoid current.

OBJECTS

It is a primary object of this invention to provide a new, improved, more reliable, and more economical circuit for actuating a reciprocating member.

It is a more specific objective of the invention to provide circuit means for intermittently energizing a solenoid coil without employing contacts which make and break the actuating current.

It is another specific object of the invention to control the energized time of a solenoid coil by the time constant of a capacitor and resistor combination and independent of mechanical motion.

It is another object of the invention to intermittently energize a solenoid coil in response to the application of dc potential and to interrupt the dc potential to the solenoid coil in response to the charging of a capacitor to a predetermined potential.

It is another object of the invention to employ contacts which are opened and closed in response to the reciprocal motion of a moving member and to use these contacts to discharge and permit the charging of a control capacitor.

It is another object of the invention to provide a structure whose repetition rate may be varied over wide limits, although it should be understood that the upper limit is a function of system inertia.

BRIEF DESCRIPTION OF THE DRAWING

The invention is illustrated in its fundamental form in a drawing comprising three figures wherein like elements are given like identifying numerals in all figures and wherein.

DESCRIPTION OF THE PREFERRED EMBODIMENT

Figure 1:
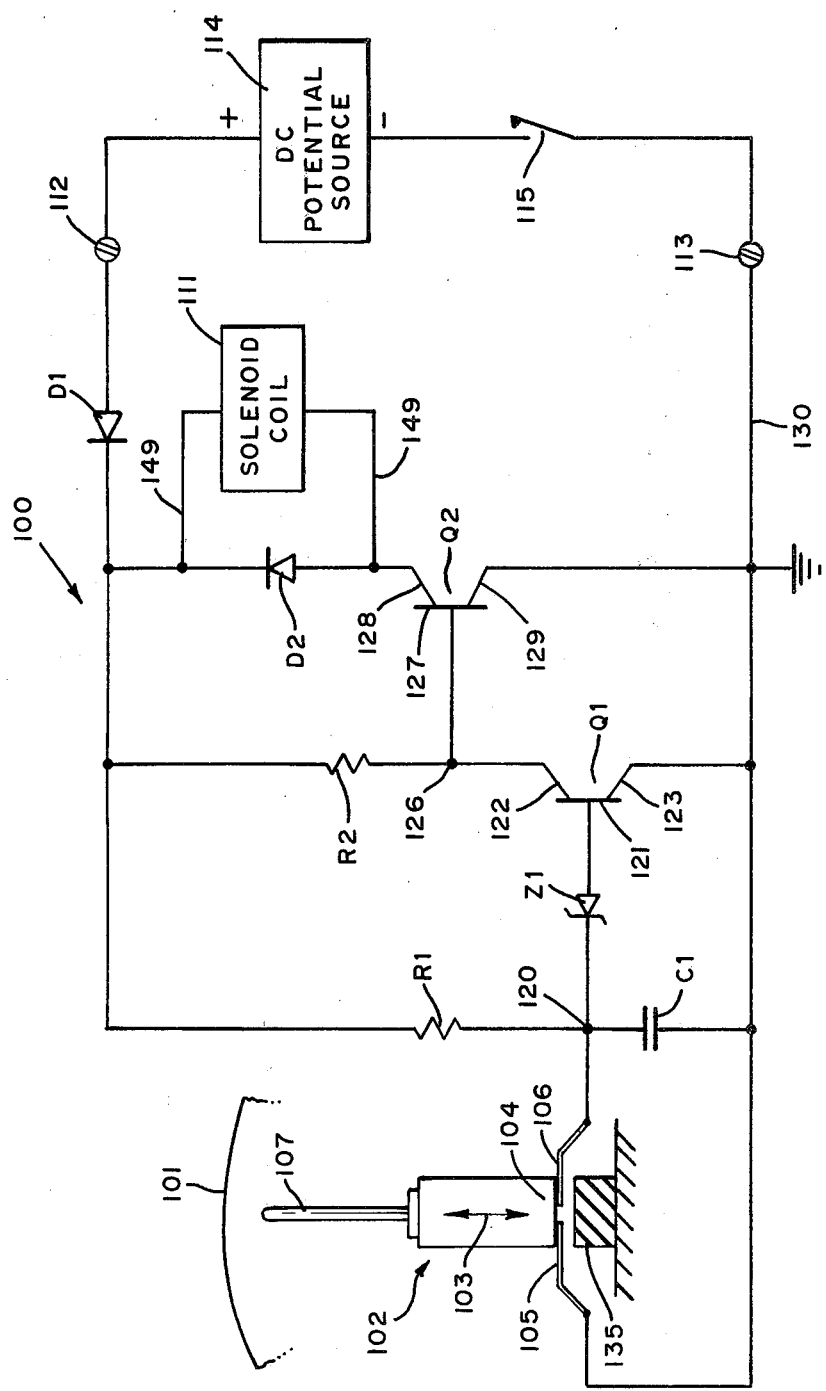
FIG. 1 comprises a circuit schematic combined with a mechanical representation of the reciprocating member.

The electrical and simple mechanical characteristics of the structure may best be understood by a consideration of FIG. 1. Typical mechanics of assembly will be most readily understood by reference to FIGS. 2 and 3.

As may be seen from FIG. 1, a typical structure incorporating the invention may comprise a structure for reciprocating a striker mechanism to strike a gong. The structure is indicated generally as 100 and includes a gong represented by the arc 101. The structure includes a reciprocating member indicated generally as 102 and which, it should be understood, is suitably mounted and confined for reciprocal linear motion as indicated by the arrow 103. The reciprocating member 102 is illustrated substantially in its rest position wherein the lower portion 104 of the reciprocating member 102 is in contact with the contact members 105 and 106. In the illustration, actual contact is not depicted in order to more clearly separate and illustrate the individual component members. In the configuration according to the drawing, the lower portion 104 comprises a conducting member which serves to complete a circuit between contact members 105 and 106 when it is in contact therewith. It should be understood that in a modified structure the contact members 105 and 106 could be designed so that either or both is a little bit longer and so that they are caused to make contact, one with the other, when the lower portion 104 of the reciprocating member 102 bears on the upper one of the contact members 105 and 106 and deflects it into contact with the other. With this alternate structure, it will be apparent that the lower portion 104 of the reciprocating member 102 would not have to be made of conducting material.

The actuating solenoid 111 is of standard construction for a structure of this type and typically encircles the reciprocating member 102 and provides a guideway therefore to restrict the direction of the motion of the reciprocating member 102 to a linear direction. Structures of this general configuration are well known and widely used, and it is believed that showing detailed structure of any specific solenoid would only tend to clutter the drawing and obscure the inventive concept.

While it is not necessary, it is anticipated that all of the electrical components illustrated in FIG. 1 will be mounted on, or supported by, the same structure which mounts the solenoid 111 and the gong 101. Accordingly, presuming this assembly technique is used, there is provided a pair of circuit connecting means 112 and 113 for providing electrical connection to the structure 100 from a potential source 114. A control switch 115 is shown to illustrate the controlled application of dc potential from source 114 to the structure 100. It should be understood that the control switch 115 may comprise any of a wide variety of switches including one which may be acutated manually and/or one which may be actuated in response to any of a variety of conditions such as time of day, temperature, sensing of abnormal conditions, and/or any of a wide variety of other conditions as determined by the specific application of the device 100.

As will be seen, the circuit comprises a pair of transistors designated Q1 and Q2, a pair of diodes designated D1 and D2, a pair of resistors designated R1 and R2, and a zener diode designated Z1, and a capacitor designated C1.

As will be seen, the dc potential source has a positive and a negative terminal; and, as illustrated, it is intended that the positive terminal of the dc potential 114 be connected to circuit terminal 112 while the negative terminal of the source 114 is connected through the control switch 115 to terminal 113. In the event that the structure 100 should be connected to the potential 114 with reverse polarity the diode D1 will be reverse-biased and will prevent circuit operation and damage thereto.

Considering now the embodiment of the invention as shown in FIG. 1, it will be seen that in response to the closing of the control switch 115, a positive dc potential is applied to the terminal 112 and a negative potential, sometimes referred to as ground, is applied to terminal 113. At the initial closing of switch 115, it will be seen that capacitor C1 is discharged because the upper and lower plates are coupled together through the contact members 105 and 106 which are bridged by the lower portion 104 of the reciprocating member 102. This maintains the point 120 at negative or ground potential; and therefore, the transistor Q1 is maintained in an off condition inasmuch as its base 121 is at a negative potential with respect to its collector 122 which is at positive potential. The potential at point 126 which is coupled to the base 127 of transistor Q2 rises to the positive potential allowed by the base-emitter junction of transistor Q2; and therefore, transistor Q2 is turned on allowing the current to flow from the positive potential of the dc potential source 114 through diode D1 and the solenoid coil 111 through the conductng transistor Q2 from the collector 128 to the emitter 129 to the ground or negative potential on lead 130. In response to this flow of current through the solenoid coil 111, the reciprocating member 102 will start to move from its rest position toward its active position thereby impelling its striker 107 towards the gong 101. As soon as the reciprocating member 102 moves from its rest position, the lower portion 104 thereof is moved and the contacts 105 and 106 are no longer bridged. With the circuit between the contacts 105 and 106 open, the capacitor C1 is allowed to charge through series resistor R1; and, in a period of time as determined by the time constant comprising the resistor R1 and the capacitor C1, the capacitor C1 will charge. When the capacitor C1 is charged to a predetermined potential, which is the breakdown voltage of the zener diode Z1, a positive potential will be applied to the base 121 of transistor Q1 thereby allowing it to conduct with current from the positive potential through resistor R2 and the collector 122 to emitter 123 to ground 130. With the conduction of transistor Q1 the point 126 is reduced from its positive potential to ground potential 130. With point 126 at ground potential the base 127 of transistor Q2 is no longer at a positive potential to allow Q2 to sustain conduction; and therefore, it is cut off. When transistor Q2 is cut off, the current to the solenoid coil 111 is interrupted.

For most effective and efficient operation, the circuit is designed so that the time constant comprising resistor R1 and capacitor C1 will allow conduction of transistor Q1 and cut off of transistor Q2 somewhat before the striker 107 has impacted the gong 101. However, because of inertia and the energy supplied by the collapsing magnetic field of the solenoid 111, the reciprocating member 102 will continue its upward journey and the striker 107 will impact the gong 101 and rebound therefrom causing the reciprocatig member to start to return to its lower or rest position. When the reciprocating member 102 returns to its lower or rest position, the lower position 104 thereof will again bridge the contact members 105 and 106 thereby discharge the capacitor C1 and cause ground potential 130 to be applied to the base 121 of transistor Q1 thereby turning it off. With the transistor Q1 turned off, the point 126 rises to a positive potential and the transistor Q2 is allowed to turn on again thereby initiating a new cycle of energization of the solenoid coil 111 and a new excursion of the reciprocating member 102.

As thus far described, the structure of FIG. 1 depends on gravity and/or rebound from the gong 101 for the return of the reciprocating member 102 to its lower position. If it is desired to use the structure 100 in an orientation wherein gravity would not assist the return of the reciprocating member 102 to its rest position, it would be possible to provide a biasing spring (not shown).

Below the contact members 105 and 106, there is illustrated a plunger cushion 135 supported on a frame member and which comprises a compressible substance. When the reciprocating member 102 first contacts the contact members 105 and 106, the capacitor C1 is discharged and the members 105 and 106 deflect downward and come in contact with the plunger cushion 135 which compresses an amount which is determined by its characteristics together with those of the contact springs 105 and 106 and the mass and velocity of the reciprocating member 102. The various materials and spacing would be chosen to provide for damping the motion of the reciprocating member and limiting vibration transmitted to other components. The cushion 135 may also return energy to the plunger 102 to assist its next cycle of upward motion.

The control switch 115 may be opened at any time to terminate the cycles of operation and the reciprocating member 102 will return to its downward position, as illustrated, to bridge the contact member 105 and 106 and to shunt and discharge the capacitor C1. The resistor R1, as has been mentioned, together with the capacitor C1 provides a time constant which controls the number of cycles of operation per unit time. It will be understood that the number of cycles of operation per unit time is also a function of the mass of the reciprocating member 102 and the distance that it is required to move. Accordingly, the interrelationship of these members must be considered during system design. That is, the inertia of the reciprocating member 102 provides an upper limit to the number of cycles of operation per unit time. The number of cycles per unit time may be reduced by increasing the time constant of the resistor R1 and capacitor C1. If it is desired to provide for field modification of this time constant, a variable resistor could be used in place of the fixed resistor R1.

The resistor R2 serves to limit the magnitude of the current through transistor Q1 and may have a value of the order of 22,000 ohms. The diode D2 prevents a high voltage spike from developing across the solenoid coil 111 when current flow therethrough is interrupted and provides for recovery of magnetic energy that would otherwise be dissipated in a spark.

From the foregoing, it will be seen that the system can readily be adjusted to energize the solenoid 111 for critical portions of the flight of the rciprocating member 102 and that the system is independent of the variations introduced by the vibrations of the gong 102.

Figure 2:
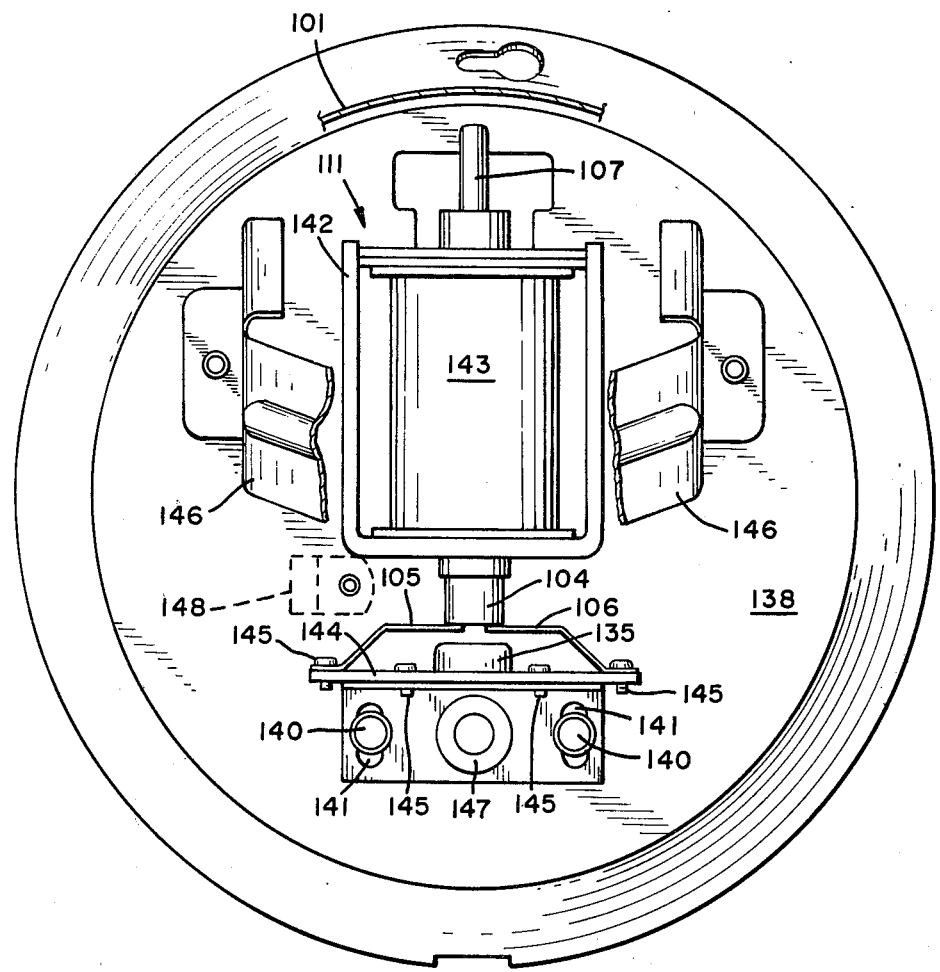
FIG. 2 comprises a simplified front view of the essential elements of the structure.
Figure 3:
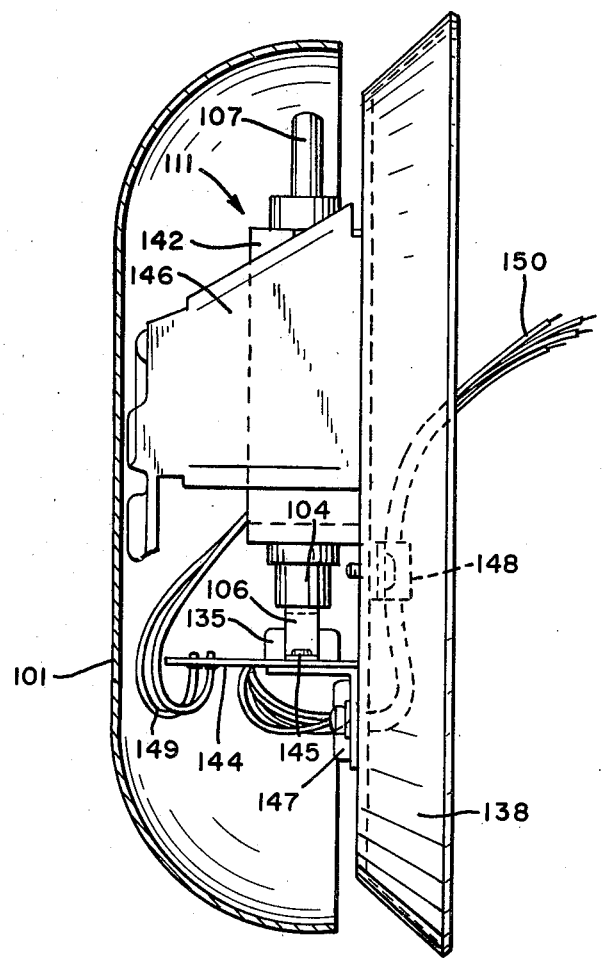
FIG. 3 comprises a side view of FIG. 2.

Considering now FIGS. 2 and 3, they will be seen to comprise a simplified front and side view of the device 100. In addition to the elements already named, it will be seen that the structure comprises several additional elements including a mounting plate 138 to which a bracket 139 is adjustably coupled by screws 140 which pass through elongated slots 141 thereby permitting adjustment of the bracket 139 with respect to the mounting plate 138. Mounted on the mounting plate 138 by means not shown is the solenoid coil 111 which includes a yoke 142 which comprises a ferromagnetic structure. The coil 143 is suitably mounted with respect to the yoke 142 to provide magnetic flux in response to the flow of current through the coil 143. Mounted to the bracket 139 is a member 144 which may comprise a printed circuit board and on which the resistors, transistors, diodes, and capacitor of FIG. 1 may be mounted. The member 144 may be mounted to the bracket 139 in any convenient fashion. The gong 101 comprises a generally bowl shaped structure which is supported by bracket 146 on the mounting plate 138 in a manner to permit some adjustment thereof and so as not to damp its vibrations in response to being struck by the striker 107.

The member 144 and the contacts 105, 106 may be secured by fastening means 145. The bracket 146, for the gong 101, is mounted on the mounting plate 138 by any suitable means. The wires 150 from the circuit pass through grommet 147 and clamp 148 to external connections. Wires 149 are the wires between the circuit and the solenoid 111.

The wires 150 may comprise four conductors to provide an "in" and "out" lead for the positive and negative terminal of the dc supply in order to permit a conventional loop test and detect a missing device 100.

It should be appreciated that the principles of the invention described could be adapted to other structures such as one wherein a member reciprocates pivotally rather than longitudinally.

While there has been shown and described what is considered at present to be a preferred embodiment of the invention, modifications thereto will readily occur to those skilled in the applicable arts. For example, the reciprocating member could be spring biased upward and pulled downward in response to energization of the solenoid coil. Or in another structure, photoelectric devices could replace the contact members wherein it is desired to have a system that is totally free of any contact closure or opening and concomitant spark possibility. This would provide a structure which is safe for use in an explosive atmosphere. It is believed that no further analysis or description is required and that the foregoing so fully reveals the gist of the present invention that those skilled in the applicable arts can adapt it to meet the exigencies of their specific requirements. It is not desired, therefore, that the invention be limited to the embodiment shown and described; and it is intended to cover in the appended claims all such modifications as fall within the true spirit and scope of the invention.

What is claimed is:

1. An electronic control means for controlling the application of dc potential to a control device, such as a solenoid actuating a reciprocally moving member moveable between rest and active positions and comprising in combination:
(a) a source of dc potential;
(b) the electronic control means being in circuit with said control device for selectively coupling said dc potential to said control device to actuate said moveable member and move it from a rest position to said active position;

(c) said electronic control means including a contact pair which is maintained closed and open when said moveable member is positioned at said rest and active positions, respectively;

(d) a capacitor included in said electronic control means and coupled in circuit with said contact pair for discharging and charging said capacitor when said contact pair is closed and open respectively; and wherein (e) said electronic control means responds to the discharged and charged state of said capacitor by permitting and restricting, respectively, the flow of current from said dc source to said control device.

2. The combination as set forth in claim 1 wherein said capacitor when charged and discharged permits and inhibits, respectively, the conduction of a first conduction control device comprising a part of said electronic control means.

3. The combination as set forth in claim 2 and including, as a part of said electronic control means, a zener diode coupled between said capacitor and said first conduction control device for inhibiting the conduction of said first conduction control device until said capacitor is charged to a predetermined potential.

4. The combination as set forth in claim 3 and including, as a part of said electronic control means, a second conduction control device coupled in series with said control device for permitting and inhibiting the flow of dc current in said control device when said second conduction control device is conducting and not conducting, respectively.

5. The combination as set forth in claim 4 wherein said second conduction control device is coupled to said first conduction control device for conduction responsive to the nonconduction of said first conduction control device.

6. The combination as set forth in claim 5 and including a resistor, as a part of said electronic control means, in series with said capacitor and the combination across said dc potential for controlling the time required to charge said capacitor to said predetermined potential.

7. The combination as set forth in claim 6 and including a diode coupled in parallel with said control device and poled to provide a circuit for dissipating the inductive energy stored in said control device in response to the conduction of said second conduction control device being inhibited.

8. The combination as set forth in claim 1 and including a plunger cushion associated with said contact pair for damping the motion of said reciprocally moving member when said moving member operates said contact pair to a closed position.

9. The combination as set forth in claim 8 wherein said contact pair is closed in response to contact by said reciprocally moving member.

10. The combination as set forth in claim 9 and including means, such as a gong, for providing an audible indication of the acutation of said moving member and which serves to limit the reciprocal motion of said moving member away from said rest position.

11. The combination as set forth in claim 10 wherein said last named means provides rebound means for damping the motion of said moving member and accelerating it towards its rest position.

* * * * *